United States Patent [19]

Kim et al.

[11] Patent Number: 5,192,992
[45] Date of Patent: Mar. 9, 1993

[54] BICMOS DEVICE AND MANUFACTURING METHOD THEREOF

[75] Inventors: Myung S. Kim, Seoul; Jong G. Kim; Hyun S. Kim, both of Kyungki, all of Rep. of Korea

[73] Assignee: Samsung Electronics Co., Ltd., Suweon, Rep. of Korea

[21] Appl. No.: 794,739

[22] Filed: Nov. 18, 1991

[30] Foreign Application Priority Data

Jun. 27, 1991 [KR] Rep. of Korea .................. 91-10768

[51] Int. Cl.$^5$ .................. H01L 27/02; H01L 21/265
[52] U.S. Cl. .................. 257/370; 437/31; 437/34; 437/41; 437/57; 257/377; 257/413; 257/554
[58] Field of Search .................. 357/23.9, 42, 43, 59, 357/67, 71; 437/31, 34, 41, 57

[56] References Cited

U.S. PATENT DOCUMENTS 5,091,760 2/1992 Maeda et al. .................. 357/43

5,102,811 4/1992 Scott .................. 437/31

*Primary Examiner*—Edward J. Wojciechowicz
*Attorney, Agent, or Firm*—Ladas & Parry

[57] ABSTRACT

A BICMOS device and manufacturing method wherein the gates of PMOS and NMOS transistors are formed by forming a first polysilicon layer which is not implanted by an impurity and forming a second polysilicon layer on the first polysilicon layer which is impurity implanted, so that the impurity doped in the second polysilicon layer is prevented from diffusing into the channel region and the voltage characteristic is prevented from changing. Emitter regions of vertical PNP and NPN bipolar transistors are self-aligned in a small chip area, and thereby the performance of the BICMOS device is improved due to the stable threshold voltage characteristic of the PMOS and NMOS transistors and high density is achieved together with improved operation speed clue to the self-alignment formation of the emitter region of the vertical PNP and NPN bipolar transistors.

12 Claims, 5 Drawing Sheets

BICMOS DEVICE AND MANUFACTURING METHOD THEREOF

BACKGROUND OF THE INVENTION

The present invention relates to a BICMOS device and manufacturing method thereof that incorporate both a bipolar transistor and a CMOS transistor in the same chip and, more particularly, to a BICMOS device and manufacturing method thereof that achieve high performance and high integration density by forming CMOS transistors with two-level polysilicon gates and by self-aligning bipolar transistors.

Recently, semiconductor devices which have various functions obtained by forming semiconductor elements with a different function and a different supply voltage in the same chip have been developed with a tendency to high speed operation and miniaturization.

As a typical example, there is known a BICMOS device which incorporates both the CMOS transistor suitable for the high integration density and low power consumption and the bipolar transistor suitable for the high speed operation and high output driving capacity into a single chip.

Since the BICMOS devices utilize the CMOS transistors in internal logic circuits and the bipolar transistors in peripheral circuits, many advantages such as low power consumption, high integration density, and high speed operation can be simply attained.

Thus, the use of the BICMOS devices becomes more and more extended. A conventinal BICMOS device was reported in 1990 (IEEE BCTM Conference Digest PP.78~81). Here, since a vertical PNP bipolar transistor has a narrow base, the driving capacity is large.

Also, since the epilayer is thinly formed to improve the operation speed, the operation voltage is low.:

But, the integration density is low since emitter regions are formed on NPN and PNP bipolar transistors by a nonself-alignment method.

Another example of a BICMOS device was published in 1990 (IEEE BCTM Conference Digest PP.82~85), where the current gain of the bipolar transistors is high, but the operation speed is low.

SUMMARY OF THE INVENTION

An object of the present invention is to provide a high-speed and a high integration BICMOS device.

Another object of the present invention is to provide a method of manufacturing such a BICMOS device.

According to a first aspect of the present invention, there is provided a BICMOS device comprising, a first MOS transistor including first conductive-type second and sixth regions formed on a first part of a first conductive-type semiconductor substrate, second conductive-type source and drain regions formed on the sixth region, separated by a channel region, a gate including a first and second polysilicon layer and a first metal silicide layer, formed on the channel region after growth of a gate oxide, metal electrodes formed on the gate, source, and drain regions, a second MOS transistor formed on second conductive-type third and seventh regions on a second part of the first conductive-type semiconductor substrate, having first conductive-type source and drain regions and having the same structure as the first MOS transistor, a vertical first bipolar transistor including first conductive-type fourth and eigth regions formed on a third part of the semiconductor substrate, a field oxide formed on said seventh region, a first conductive-type collector region formed on one side of the field oxide, connected to the fourth region, a second conductive-type intrinsic base region formed on the other side of the field oxide, second conductive-type extrinsic base regions formed on both sides of the intrinsic base region, a first conductive-type emitter region formed between the extrinsic base regions, a base electrode composed of a second polysilicon layer and a first metal silicide layer, formed on the extrinsic base regions, emitter and collector electrodes including a third polysilicon layer and a second metal silicide layer, formed respectively on the emitter and collector regions, and metal electrodes formed on the emitter electrode, the base electrode, and the collector electrode, and a second bipolar transistor composed of each region formed in second conductive-type fifth and ninth regions on a fourth side of the semiconductor substrate, which is of a conductive type opposite that of the vertical first bipolar transistor, emitter and collector electrodes including the second polysilicon layer and the first metal silicide layer, a base electrode including the third polysilicon layer and the second metal silicide layer, and metal electrodes formed on the emitter electrode, the collector electrode, and the base electrode.

According to a second aspect of the present invention, there is provided a method of manufacturing a BICMOS device, the method comprising:

a first process step of forming first conductive-type second and fourth regions and second conductive-type third and fifth regions in a first conductive-type semiconductor substrate, a second process step of forming an epitaxial layer on the semiconductor substrate, a third process step of forming first conductive-type sixth and eighth regions and second conductive-type seventh and ninth regions in the epitaxial layer, a fourth process step of forming channel stoppers between the sixth and seventh regions and between the eighth and ninth regions and of forming a field oxide layer on a predetermined part of the eight and ninth regions, a fifth process step of forming first conductive-type and second conductive-type collector regions on one side of the field oxide layer on eighth and ninth regions, in contact with the fourth and fifth regions, a sixth process step of depositing sequentially a gate oxide layer and first polycrystalline silicon layer on the entire surface of the structure, a seventh process step of forming second conductive-type and first conductive-type intrinsic base regions on the other side of the field oxide layers on the eighth and ninth regions, a eighth process step of removing the gate oxide layer and the first polysilicon layer on the eighth and ninth regions, a ninth process step of forming gates of first and second MOS transistors, the base electrode of the first bipolar transistor, and emitter and collector electrodes of a second bipolar transistor by a conventional photolithography method after forming a second polysilicon layer, a first metal silicide layer, and a first insulating layer on the entire surface of the structure, a tenth process step of implanting second conductive-type impurity ions, to form source and drain regions of the first MOS transistor, in the sixth region and implanting first conductive-type impurity ions, to form source and drain regions of the second MOS transistor, in the seventh region, an eleventh process step of forming a second insulating layer on the first and second MOS transistors, a twelfth process step of forming emitter and collector electrodes of the first bipolar transistor and a base electrode of the second bipolar transistor, respectively, by depositing a third polysilicon layer and a second metal silicide layer, a thirteenth process step of forming source and drain regions of the first and second MOS transistors and emitter and external base regions of the first and second bipolar transistors by diffusing the second conductive-type and first conductive-type implanted impurity ions of the sixth and seventh regions, respectively, and a fourteenth process step of forming metal electrodes after depositing a third insulating layer and forming contact holes therein.

DETAILED DESCRIPTION OF THE INVENTION

Figure 1:
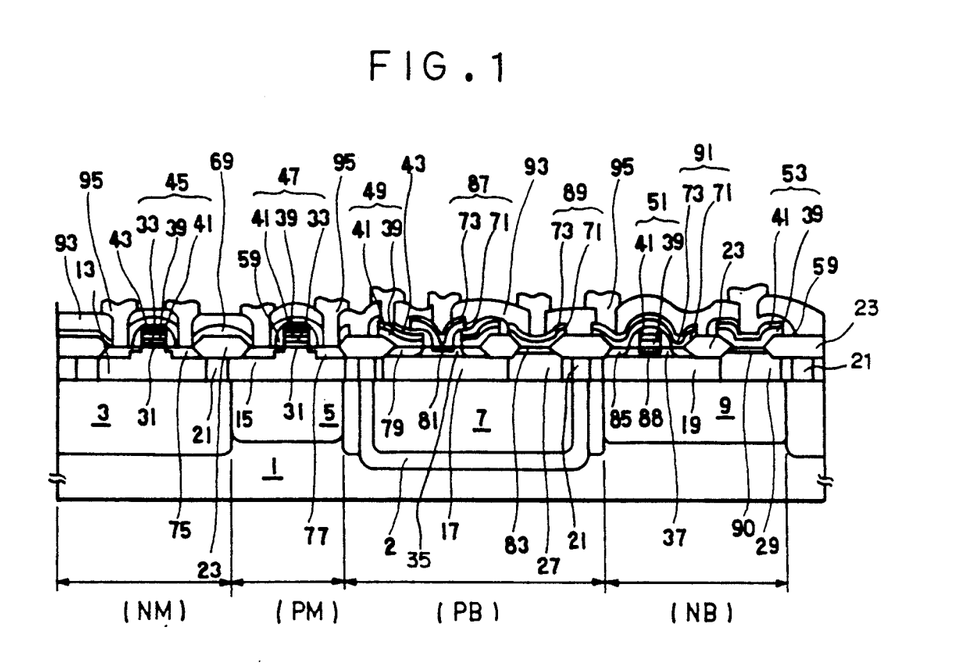
FIG. 1 is a cross-sectional view of a BICMOS device according to the present invention.

FIG. 1 shows a cross-sectional view of a BICMOS device according to the present invention, which comprises NMOS and PMOS transistors, and NPN and vertical PNP bipolar transistors.

In FIG. 1, NM, PM, NB, and PB represent a NMOS transistor region, a PMOS transistor region, an NPN bipolar transistor region, and a vertical PNP bipolar transistor region, respectively.

A highly doped second region 3, a highly doped third region 5, a highly doped fourth region 7, and a highly doped fifth region 9 are formed in NM, PM, PB, and NB regions of a P-type semiconductor substrate 1, respectively.

The second and third regions 3 and 5 are P-type and N-type buried layers, to prevent the latch-up of NMOS and PMOS transistors, respectively.

The fourth and fifth region 7 and 9 are used as buried layers of the vertical PNP bipolar transistor and the NPN bipolar transistor, respectively.

Also, a first region 2 is formed to electrically isolate the fourth region 7.

An epitaxial layer is grown on the second, third, fourth, and fifth regions 3, 5, 7, and 9, and in this epitaxial layer, sixth, seventh, eighth and ninth regions 13, 15, 17, and 19 are formed with the same conductive types as the second, third, fourth, and fifth regions 3, 5, 7, and 9, respectively.

Channel stoppers 21 are formed in the sixth, seventh, eighth, and ninth regions 13, 15, 17, and 19.

On these channel stoppers, a field oxide layer 23 is formed to electrically isolate each transistor.

Subsequently, metal electrodes 95 are formed on source and drain regions 75 of the NMOS transistor in the sixth region 13.

A gate 45 consisting of first and second polysilicon layers 33 and 39, and a first metal silicide layer 41 is formed between the source and drain regions 75 after forming a gate oxide layer 31.

The first polysilicon layer 33 of a thickness of 300~500 Å plays a role of preventing the variation of threshold voltage due to the diffusion of impurities in the second polysilicon layer 39 into the channel region, and the metal silicide layer 41 of $WSi_2$ or $TiSi_2$ with a thickness of 1000~2000 Å improves the conductivity of the gate 43.

Also, sidewalls 59 of $SiO_2$ are formed on both sides of the gate 45, and, a first insulating layer 43 is formed on the gate 45.

Also, a first insulating layer 93 is formed on the entire surface of the structure except for the metal electrodes 95.

On the other hand, the PMOS transistor is formed on the seventh region 15.

The PMOS transistor is the same as the NMOS transistor formed on the sixth region 13, except that the source and drain regions are of opposite conductive type from those of the NMOS transistor.

A N-type intrinsic base region 35 of the vertical PNP bipolar transistor is formed at the surface of the eighth region 17 and a highly doped P-type collector region 27 is separated from the intrinsic base region 35 by the field oxide layer 23.

At the surface of the collector region 27, a highly doped collector contact region 83 is formed to reduce the contact resistance.

Highly doped N-type extrinsic base regions 79 are formed on both sides of the intrinsic base region 35 and, on this extrinsic base regions, base electrodes 49 including the second polysilicon layer 39 and the first metal silicide layer 41 are formed.

The sidewall 59 and the first insulating layer 43 are formed at the side and top of the base electrode 49, and a self-aligned highly doped P-type emitter region 81 is formed below an emitter electrode 87.

Similarly, at the surface of the ninth region 19, an intrinsic base region 37, an emitter region 87, a collector region 29, an extrinsic base region 85, and a collector contact region 90 of the NPN bipolar transistor are formed.

An emitter electrode 51 composed of the second polysilicon layer 39 and the first metal silicide layer 41 is formed on the emitter region 89 and a base electrode 91 which is in contact with the extrinsic base region 85 and is electrically isolated by the side walls 59 and the first insulating layer 43 is formed on the emitter electrode 51.

The base electrode 91 is composed of the third polysilicon layer 71 and the second metal silicide layer 73, and the emitter region 87 and the extrinsic base region 85 are self-aligned by the emitter electrode 51 and the base electrode 91. A collector electrode 53 composed of the second polysilicon layer 39 and the first metal silicide layer 41 is formed on the collector region 29.

FIGS. 2A-2H show the process sequence of producing the BICMOS device shown in FIG. 1.

Figure 2A:
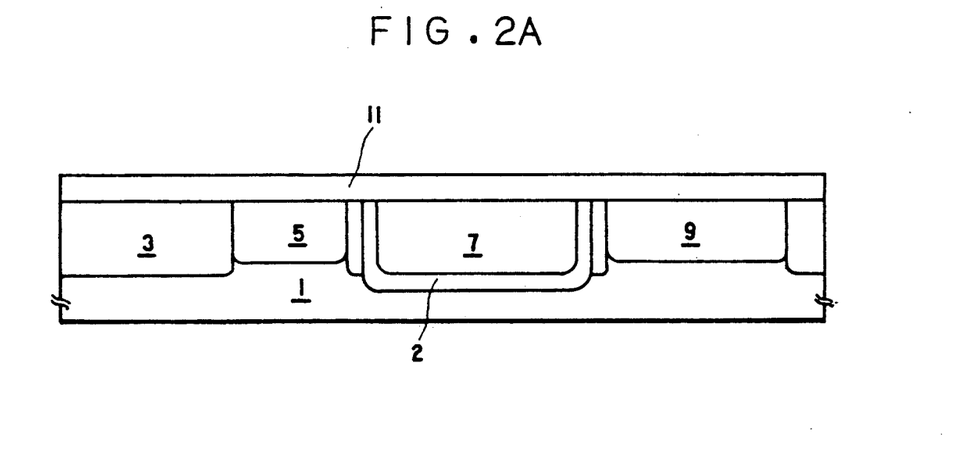
FIGS. 2A-2H are cross-sectional views explaining a method for manufacturing a BICMOS device according to the present invention.

Referring to FIG. 2A, the highly doped P-type second and fourth regions 3 and 7 and the highly doped N-type third and fifth regions 5 and 9 are formed by the conventional twin well process after forming the N-type first region 2 on the predetermined part of the P-type (100) semiconductor substrate with a resistivity of $2 \sim 20\Omega$.cm.

The fourth region 7 is separated, as an island, from the semiconductor substrate 1 by the first region 2. Next, the undoped epitaxial layer 11 of 1-2 $\mu$m is formed on the second, third, fourth, and fifth regions 3, 5, 7 and 9.

Figure 2B:
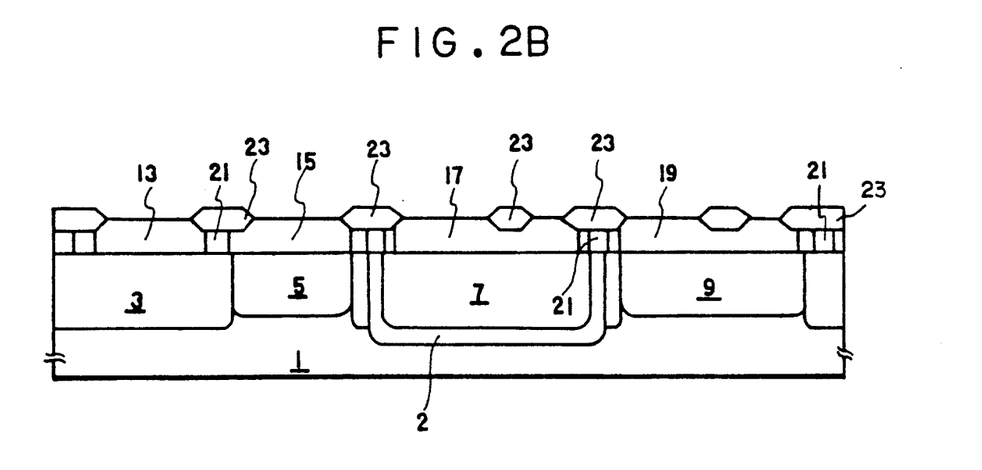

Referring to FIG. 2B, the lightly doped P-type sixth and eighth regions 13 and 17 and the lightly doped N-type seventh and ninth regions 15 and 19 are formed in the epitaxial layer 11 by the same method as that used to form the second, third, fourth, and fifth regions 3, 5, 7, and 9.

Subsequently, the field oxide layer 23 and the channel stopper 21 are formed between the sixth, seventh, eighth, and ninth regions 13, 15, 17, and 19. At this time, the field oxide layer 23 is also formed on the predetermined part of the eighth and ninth regions 17 and 19.

Figure 2C:
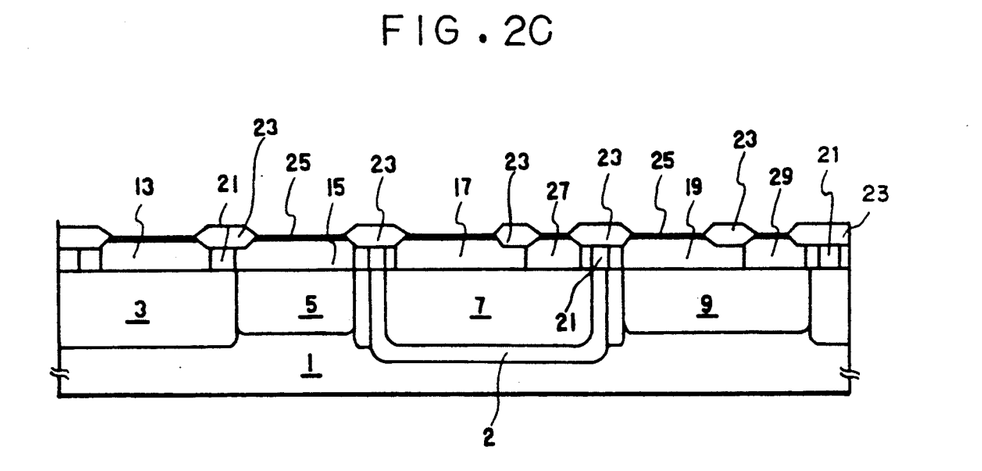

Referring to FIG. 2C, after forming a sacrificial oxide layer 25 of $400 \sim 600$ Å thickness on the entire surface of the structure, the collector regions 27 and 29 of the vertical PNP bipolar transistor and the NPN bipolar transistor are formed on the predetermined parts of the eighth and ninth regions 17 and 19, respectively. The collector regions 27 and 29 are formed by photo-masking twice and ion-implantation twice, followed by thermal annealing. In other words, the collector regions 25 and 27 are formed by the following sequence of operations; coating the photoresist on the sacrificial oxide layer 25, exposing the predetermined part of the sacrificial oxide layer 25 on the eighth region 17 by a conventional photolithography process, implanting P-type impurity ions, removing the photoresist, re-coating the photoresist, exposing the predetermined part of impurity ions, and finally removing the photoresist. In this process, the P-type impurity ions such as boron and the N-type impurity ions such as phosphorus are implanted at an energy of about 140 KeV with a dose of $5E14 \sim 2E10$ ions/cm$^2$ and the ion implantation sequence can be changed.

Figure 2D:
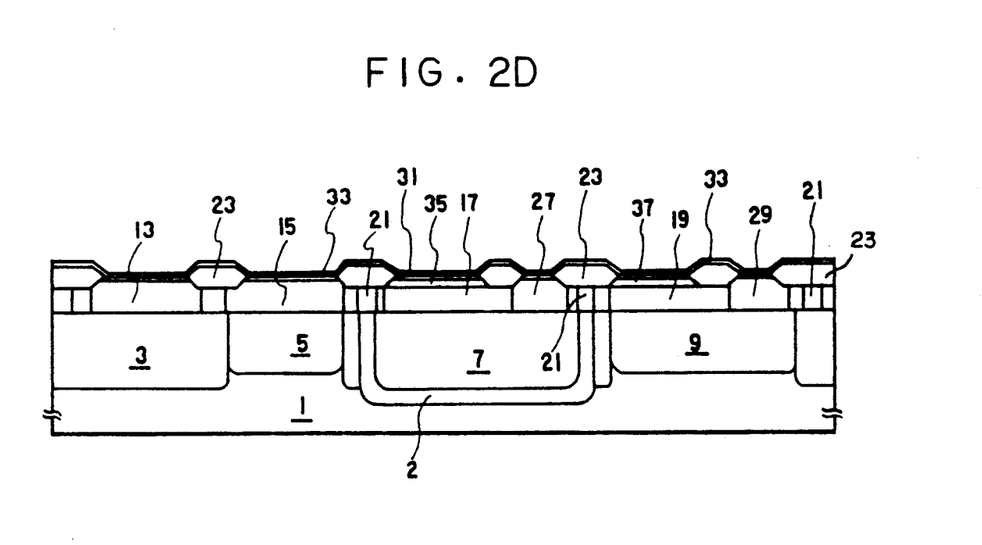

Referring to FIG. 2D, after removing the sacrificial oxide layer 25, the gate oxide layer 31 of $150 \sim 300$ Å thickness is sequentially formed. Next, the P-type impurity ions such as boron are implanted at an energy of 30 KeV with a dose of $1E11 \sim 1E13$ ions/cm$^2$ to adjust the threshold voltage of the NMOS and PMOS transistors. Subsequently, the intrinsic base regions 35 and 37 of the vertical PNP bipolar transistor and the NPN bipolar transistor are formed on the eighth and ninth regions 17 and 19 by photomasking twice and ion implantation twice, followed by thermal annealing. The intrinsic base region 35 of the vertical PNP bipolar transistor is formed by implanting N-type impurity ions such as phosphorus at an energy of about 60 KeV $\sim$ 100 KeV with a dose of $5E13 \sim 5E14$ ions/cm$^2$, while the intrinsic base region 37 of the NPN bipolar transistor is formed by the ion implantation of P-type impurities at an energy of $40 \sim 100$ KeV with a dose of $1E14 \sim 5E14$ ions/cm$^2$.

Figure 2E:
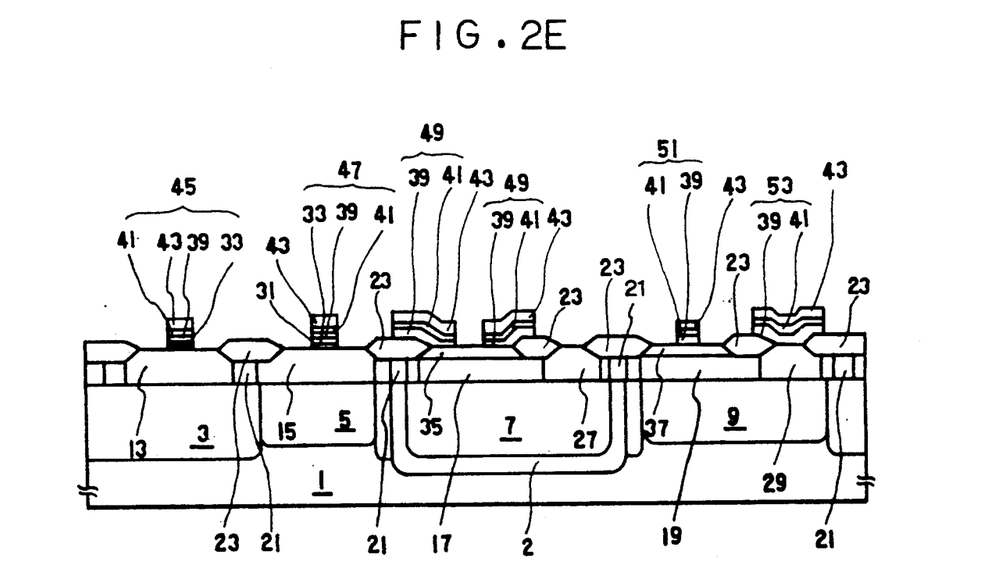

Referring to FIG. 2E, the first polysilicon layer 33 and the gate oxide layer 31 on both the vertical PNP bipolar transistor region (PB region) and the NPN bipolar transistor region (NB region) are removed, and next, the second polysilicon layer 39 of $2000 \sim 4000$ Å thickness is deposited, followed by ion-implantation of N-type impurities such as arsenic with a dose of $6E15 \sim 1E16$ ions/cm$^2$. Subsequently, the metal silicide layer 41 of $1000 \sim 3000$ Å thickness and the first insulating layer 43 of $2000 \sim 4000$ Å thickness are sequentially formed on the entire surface of the second polysilicon layer 39 by the conventional CVD (Chemical Vapor Deposition) method. The first metal silicide layer 41 is WSi$_2$ or TiSi$_2$ and is used to reduce the contact resistance with the metal electrodes formed later. Also, the first insulating layer 43 is SiO$_2$ or Si$_3$N$_4$. Next, the gate electrodes 45 and 47 of the NMOS and PMOS transistor, the base electrode 49 of the vertical PNP bipolar transistor, and the emitter and collector electrodes 51 and 53 of the NPN bipolar transistor are simultaneously formed by the conventional photolithography method.

Figure 2F:
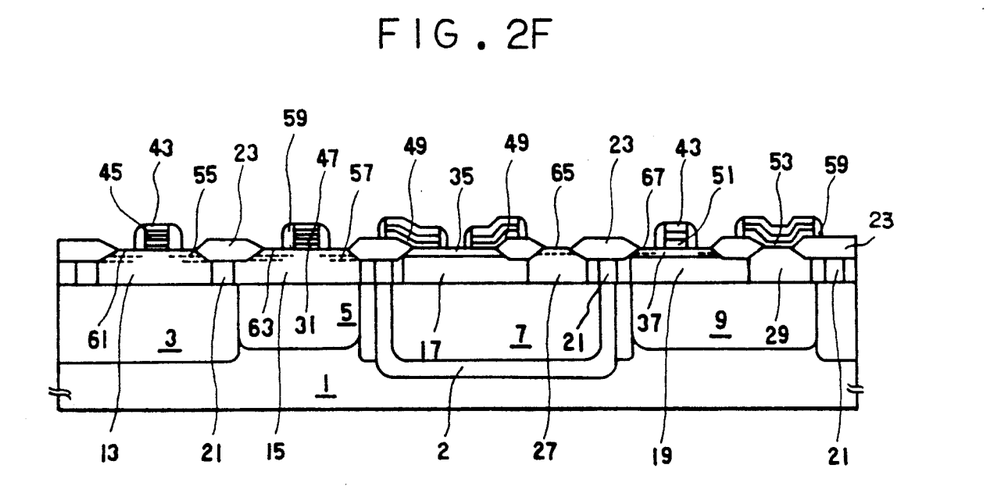

Referring to FIG. 2F, the first and second ion-implanted regions 55 and 57 are formed by ion-implantating of the N-type impurities such as phosphorus and the P-type impurities such as boron into the sixth and seventh regions 13 and 15, to form the LDD (Lightly Doped Drain) structure of the MOS transistor. Next, the sidewalls 59 are formed on both sides of the electrodes 45, 47, 49, 51, and 53 by depositing the oxide layer of $3000 \sim 6000$ Å thickness on the entire surface of the structure by the conventional CVD method and removing it again by the RIE (Reactive Ion Etching) method. Subsequently, the third ion-implanted region 61 is formed by ion implantation of the N-type impurities such as arsenic into the sixth region 13 at an energy of 60 KeV with a dose of $3E15 \sim 7E15$ ions/cm$^2$ through a photoresist mask. Similarly, the fourth ion-implanted region 4, 63 is formed by ion-implantating of the P-type impurities such as BF$_2$ at an energy of 60 KeV with a dose of $1E15 \sim 7E15$ ions/cm$^2$ into the seventh region 15. At this time, the P-type fifth and sixth ion-implanted regions 65 and 67 are also formed in the collector region 27 of the vertical PNP bipolar transistor and the intrinsic base region 37 of the NPN bipolar transistor.

Figure 2G:
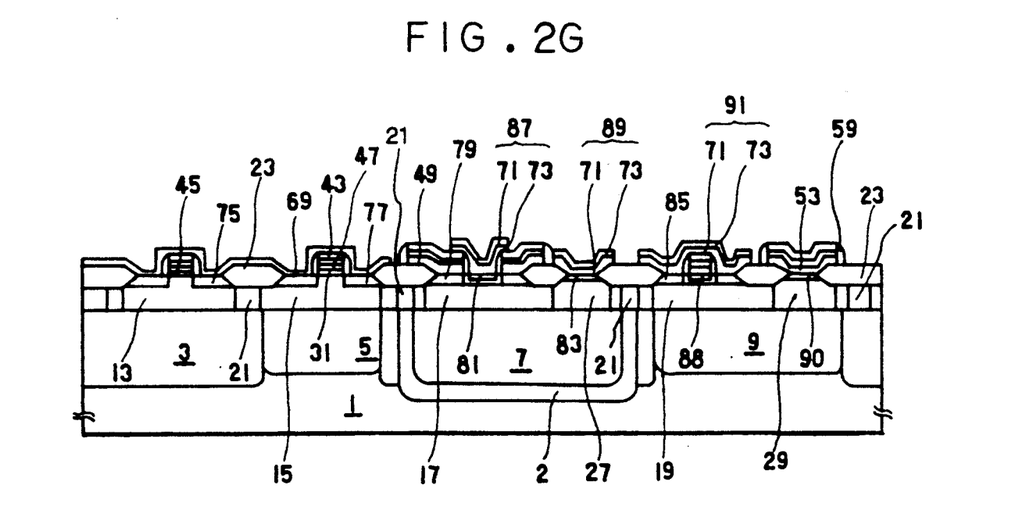

Referring to FIG. 2G, the second insulating layer 69 is formed by depositing oxide or nitride of $1000 \sim 2000$ Å thickness on the entire surface of the surface and, next, the second insulating layer on the surface of the PB and NB regions is removed by the photolithography method.

Subsequently, the third polysilicon layer 71 of $2000 \sim 4000$ Å thickness and the second metal silicide layer of $1000 \sim 2000$ Å thickness are sequentially formed on the entire surface of the structure. In the above process, the P-type impurity ions such as BF$_2$ or boron are implanted with a dose of $1E15 \sim 5E15$ ions/cm$^2$.

The second metal silicide layer 73 is formed of the same material as the first metal silicide layer 41.

By a conventional annealing process, next, the impurities of the first to sixth regions 55, 57, 61, 63, 65, and 67 are diffused, forming the source and drain regions 75 of the NMOS transistor, the source and drain region 77 of the PMOS transistor, the collector contact region 83 of the vertical PNP bipolar transistor and the extrinsic base region 85 of the NPN bipolar transistor.

At this point, the impurities in the second polysilicon layer 45 are diffused down, thereby forming the self-aligned extrinsic base region 79 of the vertical PNP transistor as well as the self-aligned emitter region 88 and the collector contact region 90 of the NPN bipolar transistor.

In addition, the impurities in the third polysilicon layer 71 are diffused down, forming the self-aligned base contact region 81 of the vertical PNP bipolar transistor. Also, the NMOS and PMOS transistors are formed in the LDD structure.

Consequently, the emitter and collector electrodes 87 and 89 of the vertical PNP bipolar transistor and the base electrode 91 of the NPN bipolar are formed by the conventional photolithography process.

Figure 2H:
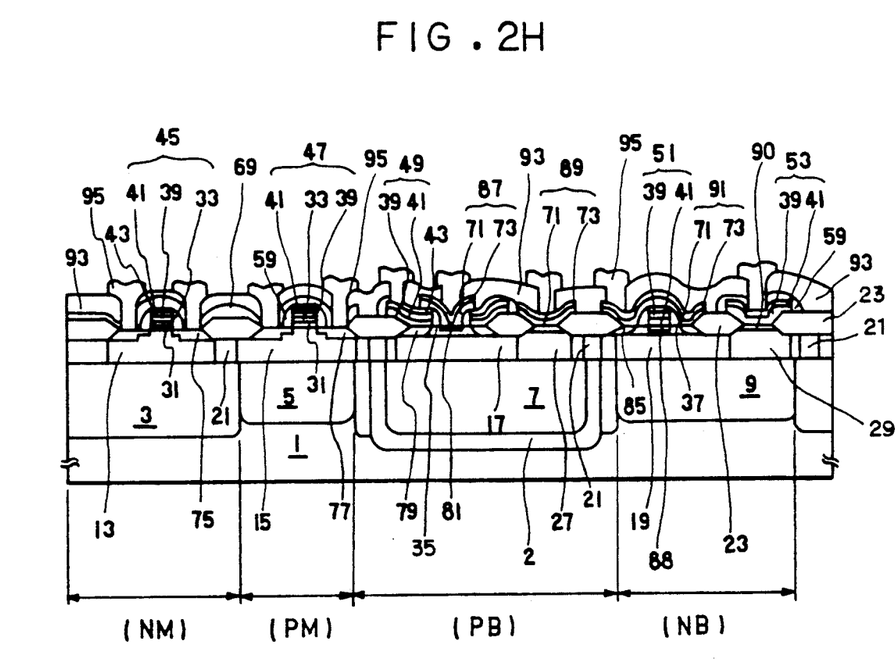

Referring to FIG. 2H, the third insulating layer 93 of 3000~5000 Å thickness, which is the same material as the first and second insulating layers 43 and 69, is formed on the entire surface of the structure by the CND method.

Finally, the metal electrode 95 of Al is formed after forming the contact holes through the third insulating layer 93.

As described above, since the gates of the NMOS and PMOS transistors are composed of the undoped first polysilicon layer and the doped second polysilicon layer, the impurity in the second polysilicon layer is not diffused down to the channel region during the thermal process, thereby preventing the variation of the threshold voltage.

In addition, the emitter regions of the vertical PNP and NPN bipolar transistors are formed by the self-aligned diffusion, thereby reducing the area of the device.

Therefore, the present invention improves the characteristics by stabilizing the threshold voltage of the PMOS and NMOS transistors.

Furthermore, the present invention improves the operation speed while reducing the chip area by the self-alignment formation of the emitter regions of the vertical PNP and NPN bipolar transistors, thereby achieving the high integration density.

What is claimed is:

1. A BICMOS device comprising:
   a first MOS transistor including first conductive-type second and sixth regions formed on a first part of a first conductive-type semiconductor substrate;
   second conductive-type source and drain regions formed on said sixth region, separated by a channel region;
   a gate including first and second polysilicon layers and a first metal silicide layer, formed on said channel region after growth of a gate oxide, and metal electrodes on said gate, source, and drain regions;
   a second MOS transistor formed on second conductive-type third and seventh regions on a second part of said first conductive-type semiconductor substrate, said second MOS transistor having first conductive-type source and drain regions and the same structure as said first MOS transistor;
   a vertical first bipolar transistor including first conductive-type fourth and eighth regions formed on a third part of said semiconductor substrate;
   a field oxide layer formed on said seventh region;
   a first conductive-type collector region formed on one side of said field oxide layer, connected to said fourth region;
   a second conductive-type intrinsic base region formed on the other side of said field oxide layer, second conductive-type extrinsic base regions formed on both sides of said intrinsic base region;
   a first conductive-type emitter region formed between said extrinsic base regions;
   a base electrode including a second polysilicon layer and a first metal silicide layer, formed on said extrinsic base regions;
   emitter and collector electrodes including a third polysilicon layer and a second metal silicide layer, formed respectively on said emitter and collector regions; and
   metal electrodes formed on said emitter electrode, said base electrode, and said collector electrode; and
   a second bipolar transistor including respective regions formed in second conductive-type fifth and ninth regions on a fourth part of said semiconductor substrate, which are of conductive-type opposite that of said vertical first bipolar transistor;
   emitter and collector electrodes including said second polysilicon layer and said first metal silicide layer;
   a base electrode including said third polysilicon layer and said second metal silicide layer; and
   metal electrodes formed on said emitter electrode, said collector electrode, and said base electrode.

2. The BICMOS device according to claim 1, wherein the thickness of said first polysilicon layer is 300~600 Å.

3. The BICMOS device according to claim 1, wherein said first bipolar transistor includes said second conductive-type first region surrounding said second region.

4. The BICMOS device according to claim 1, wherein said first bipolar transistor has said emitter region self-aligned with said base electrode.

5. The BICMOS device according to claim 1, wherein said second bipolar transistor has said extrinsic base region self-aligned with said emitter electrode.

6. A method of manufacturing a BICMOS device, said method comprising;
   a first process step of forming first conductive-type second and fourth regions and second conductive-type third and fifth regions in a first conductive-type semiconductor substrate;
   a second process step of forming an epitaxial layer on said semiconductor substrate, a third process step of forming first conductive-type sixth and eighth regions and second conductive-type seventh and ninth regions in said epitaxial layer;
   a fourth process step of forming channel stoppers between said sixth and seventh regions and between said eighth and ninth regions and of forming field oxide layers on a predetermined part of said eighth and ninth regions;
   a fifth process step of forming first conductive-type and second conductive-type collector regions on said eighth and ninth regions, in contact with said fourth and fifth regions;
   a sixth process step of sequentially depositing a gate oxide layer and a first polycrystalline silicon layer on the entire surface of the structure;
   a seventh process step of forming first conductive-type and second conductive-type intrinsic base regions on the other side of said field oxide layers on said eighth and ninth regions;
   an eighth process step of removing said gate oxide layer and said first polysilicon layer on said eighth and ninth regions;
   a ninth process step of forming gates of first and second MOS transistors, a base electrode of said first bipolar transistor; and
   emitter and collector electrodes of said second bipolar transistor by photolithograph after forming a second polysilicon layer, a first metal silicide layer, and a first insulating layer on the entire surface of the structure;

a tenth process step of implanting second conductive-type impurity ions, to form source and drain regions of said first MOS transistor, in said sixth region and implanting first conductive-type impurity ions, to form source and drain regions of said second MOS transistor, in said seventh region, an eleventh process step of forming emitter and collector electrodes of said first bipolar transistor and a base electrode of said second bipolar transistor, respectively, by depositing a third polysilicon layer and a second metal silicide layer;

a thirteenth process step of forming source and drain regions of said first and second MOS transistors and emitter and external base regions of said first and second bipolar transistors by diffusing said second conductive-type and said first conductive-type implanted impurity ions of said sixth and seventh regions, respectively; and a fourteenth process step of forming metal electrodes after depositing a third insulating layer and forming contact holes therein.

7. The method according to claim 6, further comprising a process step of forming a second conductive-type first region at a position where said fourth region will be formed in addition to said first process before formation of said second, third, fourth and fifth regions.

8. The method according to claim 6, wherein said ninth process step is achieved by ion-implantating second conductive-type impurities after deposition of said second polysilicon layer.

9. The method according to claim 6, wherein said tenth process step is achieved by ion-implantating first conductive-type impurities into both a collector region of said eighth region and an intrinsic base region of said ninth region at the same time when first conductive-type impurity ions are implanted into said seventh region.

10. The method according to claim 6, wherein said twelfth process step includes an addition process for the ion-implantation of first conductive-type impurities into said third polysilicon layer.

11. The method according to claim 6, wherein said thirteenth process step prevents the diffusion of second conductive-type impurities existing in said second polysilicon layer to said channel region by using said first polysilicon layer.

12. The method according to claim 6, wherein said thirteenth process step forms emitter and base regions of said first and second bipolar transistors by diffusion of impurities doped in said third and second polysilicon layers, respectively.

* * * * *